United States Patent
Franz

(10) Patent No.: US 8,312,981 B2
(45) Date of Patent: Nov. 20, 2012

(54) METHOD AND DEVICE FOR CONVEYING AND ROTATING IMPACT-SENSITIVE PANELS IN ULTRA CLEAN ROOMS

(75) Inventor: Roland Franz, Fuenfstetten (DE)

(73) Assignee: Grenzebach Maschinenbau GmbH, Asbach-Baeumenheim (DE)

( * ) Notice: Subject to any disclaimer, the term of this patent is extended or adjusted under 35 U.S.C. 154(b) by 48 days.

(21) Appl. No.: 12/918,147

(22) PCT Filed: Feb. 18, 2009

(86) PCT No.: PCT/DE2009/000227
§ 371 (c)(1),
(2), (4) Date: Aug. 18, 2010

(87) PCT Pub. No.: WO2009/103277
PCT Pub. Date: Aug. 27, 2009

(65) Prior Publication Data
US 2010/0326792 A1   Dec. 30, 2010

(30) Foreign Application Priority Data
Feb. 21, 2008   (DE) .......................... 10 2008 010 317

(51) Int. Cl.
*B65G 47/46*   (2006.01)
(52) U.S. Cl. ................. 198/370.09; 198/371.3; 198/413
(58) Field of Classification Search .......... 198/370.09, 198/371.3, 401, 406, 409, 411, 412, 413, 198/782, 787
See application file for complete search history.

(56) References Cited

U.S. PATENT DOCUMENTS

| | | | |
|---|---|---|---|
| 3,680,677 A | 8/1972 | Branch et al. | |
| 4,312,444 A | 1/1982 | Mushovic | |
| 4,456,116 A * | 6/1984 | Jarman .......................... | 198/414 |

(Continued)

FOREIGN PATENT DOCUMENTS

DE   2642627   4/1977
(Continued)

OTHER PUBLICATIONS

Japanese Patent Office; "Notice of Reasons for Rejection" mailed on May 15, 2012, on parallel Japanese Patent Application No. 2010-547041; pp. 1-11.

*Primary Examiner* — James R Bidwell
(74) *Attorney, Agent, or Firm* — Duane Morris LLP; J. Rodman Steele, Jr.; Gregory M. Lefkowitz

(57) ABSTRACT

A method and a device for the contamination-free, precise-track conveying and rotating on one plane of thin, impact-sensitive crystalline panels, in particular glass panels is described. The method includes the following features: a) a glass panel (6) is conveyed over parallel mounted carriers (9) of a roller conveyor, the surface of the rollers having a thread-type structure; b) to alter the travelling direction of a glass panel (6), other supplementary rollers (7) are provided in the space between the rollers (8) in the appropriate region of the roller conveyor, said other rollers being lifted above the level of the roller conveyor by means of a lifting device; and c) to rotate a glass panel (6) independently of the travelling direction, other supplementary rollers (10) are provided in the space between the rollers (8) in the appropriate region of the roller conveyor.

10 Claims, 4 Drawing Sheets

U.S. PATENT DOCUMENTS

| | | | |
|---|---|---|---|
| 5,000,305 A * | 3/1991 | Lucas | 198/782 |
| 5,293,984 A | 3/1994 | Lucas | |
| 6,059,095 A | 5/2000 | Tsuji | |
| 7,188,721 B1 * | 3/2007 | Wu et al. | 198/414 |
| 7,464,622 B2 | 12/2008 | Markert et al. | |
| 7,497,317 B2 * | 3/2009 | Chang et al. | 198/370.09 |
| 2011/0005903 A1 | 1/2011 | Niewiera | |

FOREIGN PATENT DOCUMENTS

| | | |
|---|---|---|
| DE | 2642627 A1 | 4/1977 |
| DE | 19610157 | 9/1996 |
| DE | 19620493 | 11/1997 |
| DE | 19610157 B4 | 6/2005 |
| DE | 102004012043 | 9/2005 |
| DE | 20 2007 015 168 U1 | 1/2008 |
| GB | 1405679 | 9/1975 |
| JP | 5018981 A | 1/1993 |
| JP | 5246534 A | 9/1993 |
| JP | 10218418 A | 8/1998 |
| JP | 2004284772 | 10/2004 |
| JP | 2008019009 A | 1/2008 |
| TW | 227212 | 2/2005 |
| WO | WO2004/050420 | 6/2004 |

* cited by examiner

METHOD AND DEVICE FOR CONVEYING AND ROTATING IMPACT-SENSITIVE PANELS IN ULTRA CLEAN ROOMS

CROSS-REFERENCE TO RELATED APPLICATIONS

This application is a §371 national stage entry of International Application No. PCT/DE2009/000227, filed Feb. 18, 2009, which claims priority to German Patent Application No. 10 2008 010 317.9, filed Feb. 21, 2008, both of which are hereby incorporated by reference.

BACKGROUND

Modern glass facades are a conspicuous feature of modern architecture. In many cases, however these are not just a functional element of a structure but increasingly also serve for solar power generation. Tailor-made solar modules allow precise integration into structural grid patterns and profiles. Semitransparent solar cells and even opaque solar cells with transparent areas allow photovoltaic glazing to appear suffused with light. At the same time the solar cells often serve to give the desired effect of sunscreen and glare protection.

The manufacture of such photovoltaic systems requires working conditions that are primarily encountered in the manufacture of semiconductors and integrated electronic circuits. In the manufacture of photovoltaic systems, however, these so-called clean-room conditions additionally necessitate the handling of extensive, impact-sensitive glass panels.

The manufacture and further processing of such impact-sensitive panels is also required in the high-volume production of larger types of flat screens. For the record: modern flat screens are increasingly replacing the old television tube monitors and are moreover constantly coming down in price.

They are based on TFT/LCD technology. LCD (Liquid Crystal Display) here stands for the use of liquid crystals in the individual pixels of the screen and TFT here stands for 'Thin Film Transistor'. The TFT's are minute transistor elements, which control the orientation of the liquid crystals and hence their light transmission.

A flat screen display is composed of numerous pixels. Each pixel in turn comprises 3 LCD cells (sub-pixels), corresponding to the colors red, green and blue. A 1.5-inch screen (measured diagonally) contains approximately 800,000 pixels or approximately 2.4 million LCD cells.

For a better understanding of the working principle: A liquid crystal cell (LCD cell) functions in a similar way to Polaroid sunglasses. If you hold two Polaroid glasses one over the other and begin to rotate them in opposite directions to one another, you will at first see less and less and then nothing more at all. This effect comes about because Polaroid glass is transparent only to light waves oscillating in a specific plane. If two such glasses are held one over the other and rotated through 90° in opposite directions to one another, although a fraction of the light can still pass through the first glass it can no longer pass through the second, since this is now situated at right angles to the incident light waves and filters them out.

An LCD cell works on the same principle. It comprises two Polaroid glasses rotated by 90° in opposite directions to one another, through which, as explained above, no light can therefore pass. Between these two Polaroid glasses is a layer of liquid crystals, which have the natural characteristic of rotating the plane of oscillation of light. This liquid crystal layer is just thick enough to turn the light passing through the first Polaroid glass back through 90°, thereby allowing it to pass through the second Polaroid glass and making it visible to the viewer.

If the liquid crystal molecules are then turned out of their natural position by the application of an electrical voltage, less light passes through the cell and the corresponding pixel becomes dark. The corresponding voltage is generated by a TFT element, which forms part of each LCD cell. The light for the LCD display is produced in the rear part of the screen housing by small fluorescent tubes like those of larger size used for room lighting.

Since each pixel has three color filters for the colors red, green and blue, controlling the transparency of these filters allows each pixel to assume a desired color mixture or a desired color.

Flat screens have an outstanding definition and an adequate color quality for standard office applications. TFT's also have a lot to offer in terms of ergonomics: they take up less space, they have only one third of the power consumption of a tube monitor and they emit much less radiation.

As is usual in microelectronics, so-called ultra clean rooms are essential for the manufacture of TFT screens. This is necessary since, in view of the small size of the conductive structures, even small particles occurring during the production process can cause discontinuities. In the manufacture of a TFT screen such a discontinuity would result in the failure of a pixel. The manufacture of such screens therefore demands ultra clean room conditions.

A clean room or an ultra clean room is a room in which the concentration of airborne particles is controlled. It is designed and used so that the number of particles entrained into the room or generated in the room and deposited there is minimal and other parameters such as temperature, humidity or atmospheric pressure are controlled as necessary.

On the one hand the TFT screens are at present constantly coming down in price, on the other hand there is an increasing trend in demand towards screens of enormous sizes. This trend is all the more pronounced given that such screens not only lend themselves very readily to large events but also come in affordable price ranges as a result of the modern production engineering.

However, the production of large screens, particularly in ultra clean rooms, requires special machines for handling the extensive, thin glass panels needed for this.

Multi-axial industrial robots can primarily be used for this purpose. The use of many different types of multi-axial industrial robots may be classed as state of the art in the production engineering of a wide variety of products.

Such industrial robots are generally used in large workshops for transporting awkward, heavy loads but can also be profitably used in the production of smaller machine parts. In all cases what matters here is the reproducible precision of the movement sequences involved in the individual grasping operations, transporting movements and depositing operations.

In many cases it is not important under what circumstances these movement sequences take place. For example, it generally does not matter what level of noise such a sequence of movements will cause, or whether such an operation is associated with movements of dust or a greater or lesser escape of lubricant. Even some unavoidable wear of moving machine parts giving rise to friction is generally of no significance.

Such attendant natural phenomena are to be viewed quite differently when working in an environment at risk from contamination, such as in the foodstuffs processing industry, for example, in the pharmaceutical industry or precisely in the manufacture of semiconductors in ultra clean rooms.

Thus the state of the art EP 1 541 296 A1 discloses a handling appliance, such as an industrial robot, for use in environments at risk from contamination, having a number of scavenging chambers, to which a scavenging medium can be admitted, in the area of drive units of the handling appliance. The object in the case of such an appliance is to develop the appliance, simplifying the design and thereby in particular making it cost-effective, so as to allow the handling appliance to be used safely in an environment at risk from contamination.

This object is achieved in that a separate scavenging chamber is assigned to each of a plurality of drive unit groups. Although the environment in which such an industrial robot is intended to be used is more sensitive to contamination than a normal environment and greater demands are therefore also placed on the design configuration, such special demands are not comparable with the conditions specified in ultra clean rooms.

Apart from this, their crystalline structure and at the same time their relatively large mass make large, thin glass panels, like those which are also used for the production of large TFT screens, extremely sensitive to minimal impacts. The lack of sensitivity and insufficient positioning accuracy for such applications therefore make an industrial robot unsuited to the handling of large, thin glass panels in ultra clean rooms.

The conveying of large, impact-sensitive glass panels in a horizontal orientation, and rotating these, demands particular attention under ultra clean room conditions.

Another aspect in maintaining ultra clean room conditions, particularly in the production of cost-intensive products, is the risk of contamination by humans. An involuntary sneeze here is capable of destroying an entire unit of production. Such a system likewise demands greater reliability. Since the procurement and operating costs of a correspondingly designed industrial robot are high, the economic cost of such a system is also important.

It is to be remembered, especially in the handling of extensive glass panels by an industrial robot, that the movement gives such large expanses a tendency to oscillate. This may be caused on the one hand by the suction elements adhering at only a few points and on the other by the accelerated movement sequences of such robots. With such oscillation phenomena there is an additional risk of glass fracturing.

DE 20 2007 015 168 U1 discloses a device for the contamination-free handling of impact-sensitive glass panels in ultra clean rooms. The object of this device used in turning large, thin glass panels under ultra clean room conditions is to ensure a production process or a feed delivery to a specific production process, which proceeds without human access but which is controlled and monitored by humans outside the production process. The corresponding device must be reliable and cost-effective in the manufacturing process. The movement sequences of the glass panels must preclude unwanted oscillations.

The devices described here largely serve to orient and carry the glass panels in a horizontal position by means of slide elements under ultra clean room conditions and to swivel them into a vertical position where they are subjected to fine alignment. The problem of conveying glass panels on a precise path over longer distances and over angled paths including rotations is not addressed there.

DE 26 42 627 A1 discloses a conveying roller for a hardening bath, particularly in fully automatic hardening plants. The object of this publication is to design the conveying roller used so as to avoid, if at all possible, any influencing of the hardening effect due to the contact between the hardened material and the roller. This publication does not appear to offer the person skilled in the art any suggestions with regard to the object of automatically conveying large, thin glass panels under ultra clean room conditions without human access.

DE 698 27 983 T2 describes a conveying roller and a method for its manufacture, with the object of achieving a simplified method of production. Here it is essentially proposed to produce the inner layer from a thermoplastic resin and the outer layer from an elastomer. This method of production does not appear to offer a person skilled in the art any direct reference to the conveying of glass panels.

DE 196 20 493 A1 discloses a lifting device for roller rails of roller tables. Although such a lifting device is capable of raising glass panels from a production line, such a lifting device is not suitable for further steps in the method.

DE 10 2004 012 043 A1 relates to a device and a method for the correctly positioned transfer of solid, rectangular items. This serves for the correctly positioned transfer of solid rectangular items in a flow of items, making it possible to transfer a maximum number of items on to a table in automated operation. Any reference to the conveying of glass panels seems to consist solely of the claimed use of a computer using the registered geometric data of the pre-sorted items in an optimum spacing pattern.

DE 203 16 236 U1 has disclosed a chainless freight drive, in which the most cost-effective manufacture, the operating reliability and low maintenance are of prime concern. This freight drive is also intended to meet high hygiene requirements. Here the driving of rollers for conveying glass panels is significant only as one facet of the conveying of glass panels.

DE 196 10 157 B4 describes a roller conveyor section, which achieves the object of also being able to drive a larger number of conveying rollers in two conveying directions running at right angles to one another for a relatively low design outlay. This too relates only to one facet of the conveying of glass panels, which has nothing to do, however, with achieving the object of the invention.

SUMMARY OF THE INVENTION

Therefore the object of the device according to the invention and of the method according to the invention, for conveying large, thin glass panels under ultra clean room conditions is to ensure a production process or a feed delivery to a specific production process, which can proceed without human access but which is controlled and monitored by humans outside the production process.

The glass panels are therefore to be capable of being conveyed and if necessary rotated without oscillations and on a precise path, even over longer distances and over angled paths.

The corresponding device must be reliable and cost-effective in the manufacturing process.

This object is achieved by a device and method as described herein.

BRIEF DESCRIPTION OF THE DRAWINGS

The device according to the invention will be described in more detail below. Of the individual figures.

DETAILED DESCRIPTION

In the schematic representation of the possibilities of a device according to the invention in FIG. 1, the upper part represents a roller conveyor, which brings glass panels (6) from an earlier position in the production process and subsequently advances them, rotated through an angle of 90°.

Should such a glass panel be subsequently rotated, in order to retain the original orientation on the roller conveyor, for example, it is the following rotating device that serves to re-establish the original position of the glass panel on the roller conveyor.

Figure 1:
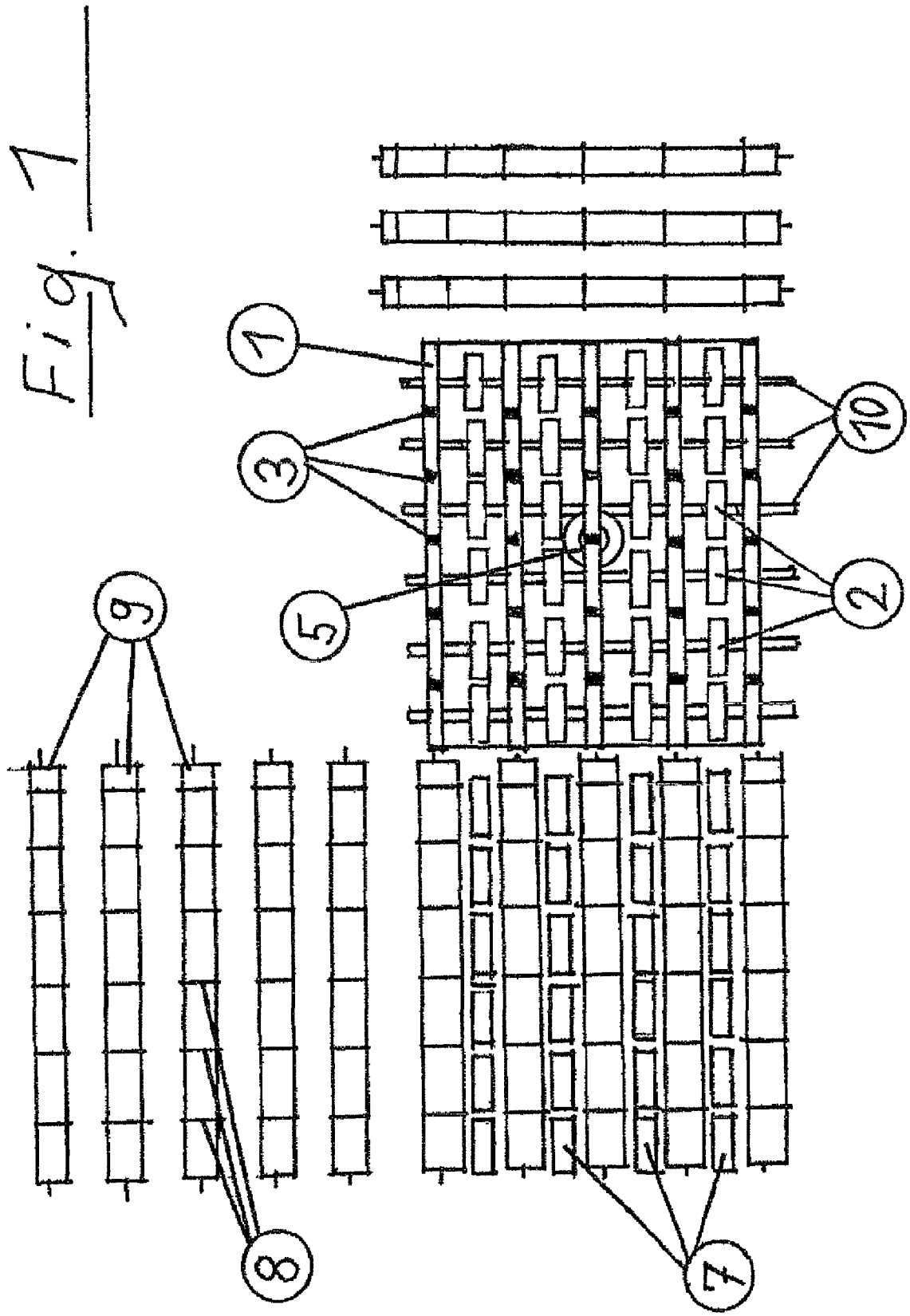
FIG. 1: shows a representation of the conveying and rotating device according to the invention in plan view.

Also sketched in this FIG. 1 are the carriers (9) of the roller conveyor and the carrier rollers (8). The conveying rollers (7) of the angle conveyor can be seen in the spaces between corresponding carrier rollers (8). The carrier rollers (2) of the rotating device in the running direction of the glass panels (6) to the carrier rollers (7) of the angle conveyor are also represented in the plan view. The corresponding carriers of the rotating deck are denoted by (10). The support points (3) serve as support for a glass panel (6). The lifting device (5) for the rotating frame (1) can be seen in the middle of the rotating device. The three carrier rollers of a further roller conveyor visible on the right-hand side serve to represent the onward conveying of the glass.

Figure 2:
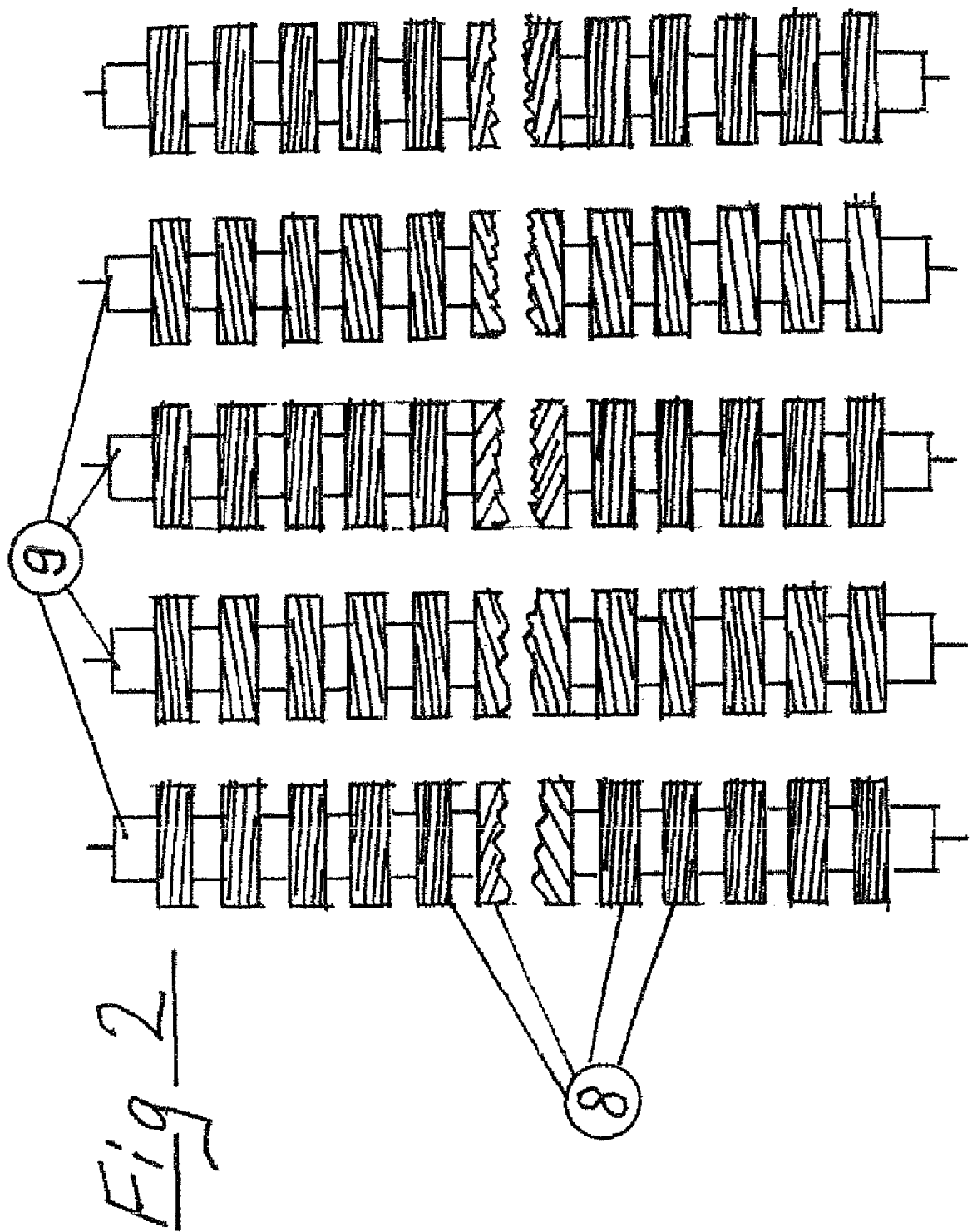
FIG. 2: shows a schematic representation of the distribution of the carrier rollers of a roller conveyor.

FIG. 2 shows a schematic representation of the distribution of the carrier rollers of the roller conveyor. It can be seen here that the surfaces of the carrier rollers (8) of a roller conveyor on a carrier (9) have a structure resembling a helix. This same structure of the carrier rollers (8) occurs on each adjacent carrier (9), but in the opposite direction. According to the invention a high-grade water cross-linked PUR elastomer, for example the material Aclathan (registered trademark) is used as material for these carrier rollers (8). In addition to a high mechanical strength this material has an extremely long service life and has exceptionally good abrasion properties as well as good adhesion and grip. These characteristics are very important especially for applications under ultra clean room conditions.

This ensures that even the largest glass panels (6) do not swing up whilst they are being conveyed by the carrier rollers (8), but can be conveyed on a precise path without correction by humans or a special device.

The width of the roller conveyor or the length of the respective carriers (9) is determined by the size of the glass panels (6) to be conveyed. In the representation in FIG. 2 the carriers (9) represented are therefore shown interrupted in the central area.

Figure 3:
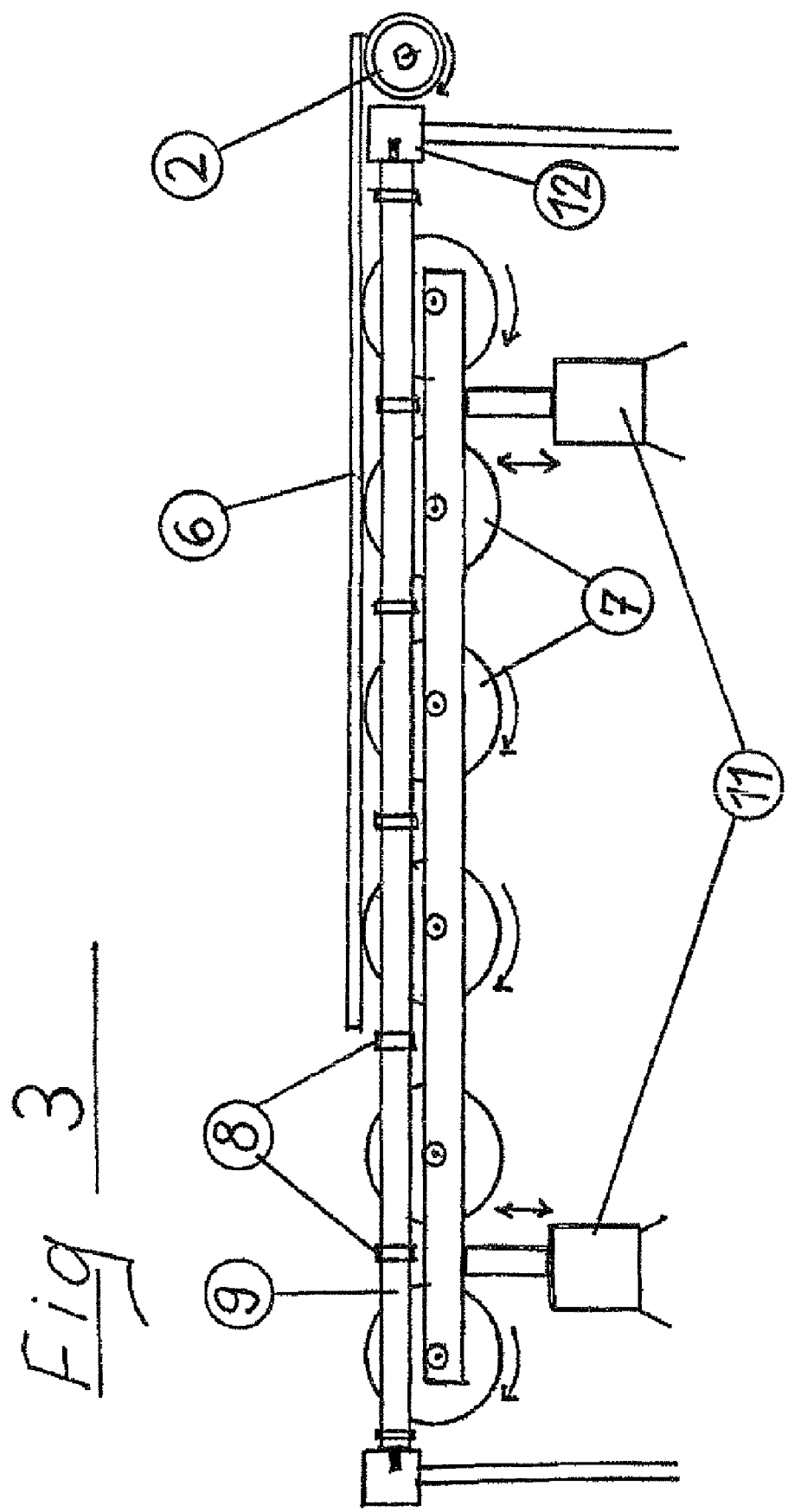
FIG. 3: shows the lifting device of an angle conveyor in cross section.

The cross section through the angle conveyor shown in FIG. 3 shows a lifting device (11) on the left-hand side and on the right-hand side, which devices serve, by means of the frame shown, for raising the carrier rollers (7), which according to FIG. 1 can pass through between the carrier rollers (8) of the roller conveyor. In this representation the carrier rollers (8) of the roller conveyor shown can be recognized by the relatively small diameter, the corresponding carrier roller drive (12) being situated on the right-hand side. In the example in FIG. 1 the carrier rollers (7) are arranged so that the respective glass panel (6) is turned at an angle of 90°. The running direction of the flow of material being conveyed in the ultra clean room can also be adjusted by an angle other than an angle of 90°, however, by correspondingly rotating the conveying rollers (7) in the area between the carrier rollers (8). Should it prove necessary here to widen the space between the corresponding carrier rollers (8) for this purpose, this space is adjustable as required. In taking such a measure the running direction of the carrier rollers (2) of the following rotating device must naturally be adjusted to the running direction of the carrier rollers (8).

A carrier roller (2) of the following rotating device, which ensures the uninterrupted movement flow of a glass panel (6), is shown on the right-hand side of FIG. 3.

Should it prove necessary to design a production line so that the angle conveyor forms a variable angle in relation to the roller conveyor, the person skilled in the art will be capable of achieving this by means of corresponding sensors, adjusting devices and controls. The lifting device (5) of following rotating device would then have to be endowed with an additional facility for variable movement in that plane.

Figure 4:
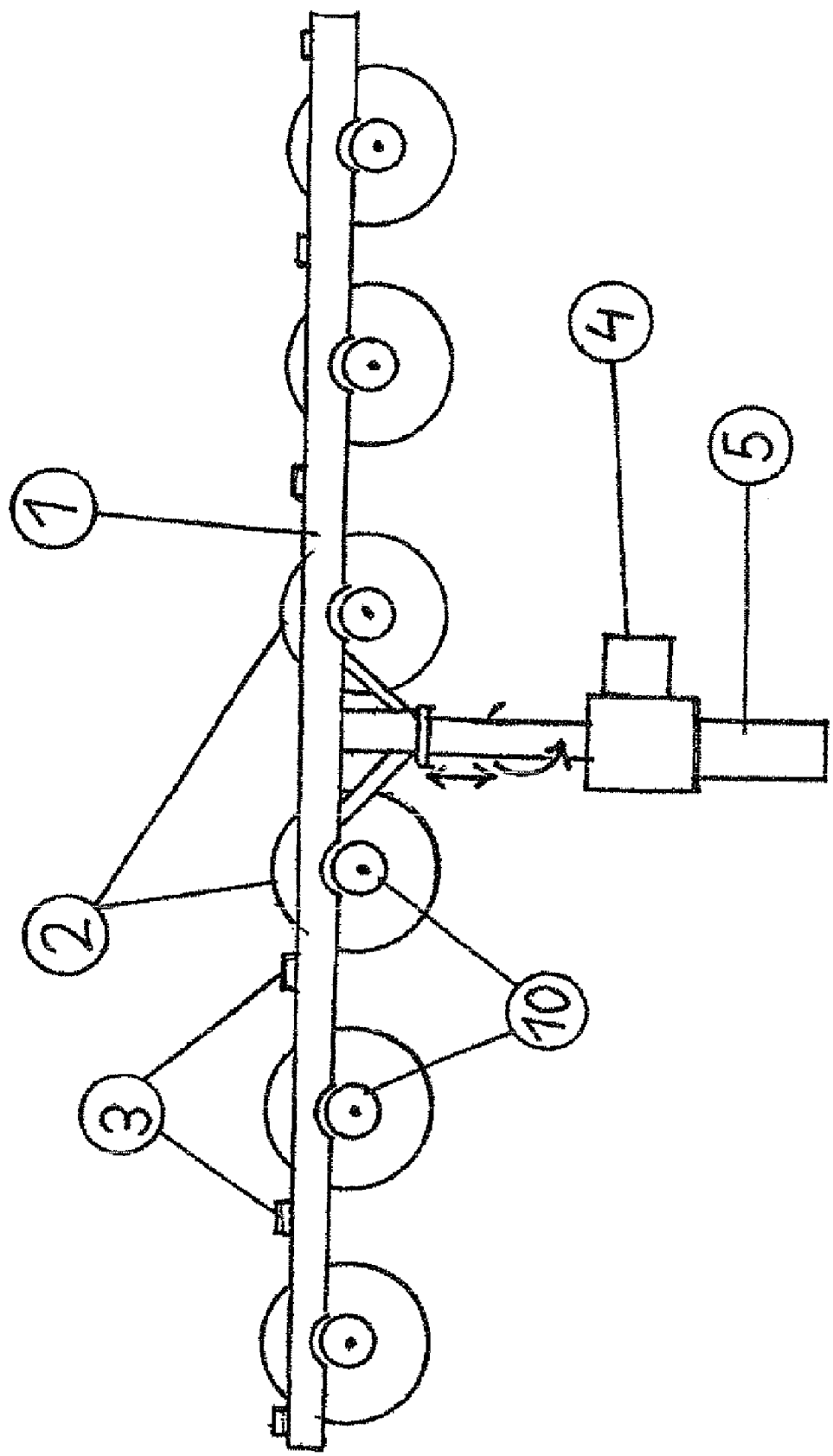
FIG. 4: shows a rotating device in cross section.

The representation in FIG. 4 shows a cross section through the rotating device in FIG. 1. The rotating frame (1) shown in section here carries the support (3), which in the nature of bearing points distributed on the rotating frame carries the respective glass panel (6). The lifting device (5) and the rotating frame (4) serve to raise and rotate a glass panel (6) and to set it down again on the carrier rollers with the corresponding carriers (10). After the desired rotation it is conveyed onwards over a further roller conveyor to the required place of use. It goes without saying that the conveying elements shown may be arranged in series in any number on a longer conveying line, as necessary. Here the advantage of the inventive arrangement of carrier rollers (8), which ensures that the conveyed panels are guided on a precise path, has an especially positive effect.

The sensors and control elements required for an automatically running conveying operation have been omitted for reasons of clarity.

The interactive control of each of the moving elements, control elements and sensors used requires a special control program.

LIST OF REFERENCE NUMERALS (1) rotating frame
(2) carrier rollers of the rotating device
(3) support for a glass pane
(4) rotary drive
(5) lifting device for the rotating frame
(6) glass panel
(7) conveying rollers of the angle conveyor
(8) carrier rollers of the roller conveyor
(9) carriers of the roller conveyor
(10) carriers of the rotating deck
(11) lifting device of the angle conveyor
(12) carrier drive of the roller conveyor

The invention claimed is:

1. A device for the contamination-free and precise-path conveying and rotating of thin, impact-sensitive crystalline panels, in particular glass panels, in one plane, comprising:
   a) a roller conveyor, in which the surfaces of the carrier rollers (8) have a structure resembling a helix, adjacent carriers (9) have helical structures of the carrier rollers (8) running in opposite directions, and a high-grade water cross-linked polyurethane elastomer is used as material for the carrier rollers (8),
   b) a further, second roller conveyor acting as an angle conveyor, in which in a corresponding area additional rollers (7), which run in a required direction and are rotatable in respect of their carriers, and which can be raised above the level of the roller conveyor by means of a lifting device, are provided in a space between the rollers (8),
   c) a further, third roller conveyor, in which in the corresponding area additional further rollers (10), which can be raised above the level of the roller conveyor by means of a centrally supported, rotatable lifting device, are provided in the space between the rollers (8) for a rotation of a glass panel (6) independent of the running direction,
d) a device for adjusting the spacing of the carriers (9) in the area of the second roller conveyor acting as said angle conveyor,
e) a device for monitoring the positioning of a glass panel (6) by means of lasers and/or sensors.

2. The device as claimed in claim 1, wherein the material Aclathan (registered trademark) is used as polyurethane elastomer.

3. The device as claimed in either of the preceding claims, wherein a support (3) of the rotating frame (1) is made from polyether ether ketone (PEEK) plastic.

4. The device as claimed in claim 1, wherein mechanically moving parts thereof are encapsulated free of emissions and are made from abrasion-resistant material.

5. The device as claimed in claim 1, wherein the conveying direction of the conveying rollers (7) forms an angle of 90 degrees to the direction of the roller conveyor.

6. The device as claimed in claim 1, wherein the rollers (2) are each provided with a separate servo drive.

7. A method for the contamination-free and precise-path conveying and rotating of thin, impact-sensitive crystalline panels, in particular glass panels, in one plane, comprising:
 a) a glass panel (6) is conveyed over parallel mounted carriers (9) of a roller conveyor fitted with carrier rollers (8) arranged side by side, the surfaces of the carrier rollers (8) having a structure resembling a helix, adjacent carriers (9) having helical structures of the carrier rollers (8) running in opposite directions, and a high-grade water cross-linked polyurethane elastomer being used as material for the carrier rollers (8),
 b) for an adjustment of the running direction of a glass panel (6), this is conveyed into a corresponding area of a further, second roller conveyor acting as an angle conveyor, in which additional rollers (7), which run in the required direction and are rotatable in respect of their carriers, and which can be raised above the level of the roller conveyor by means of a lifting device, are provided in a space between the rollers (8) and convey the respective glass panel (6) in the required new direction,
 c) for a rotation of a glass panel (6) independent of the running direction, this is conveyed into a corresponding area of a further, third roller conveyor, in which additional further rollers (10), which can be raised above the level of the roller conveyor by means of a centrally supported, rotatable lifting device, are provided in the space between the rollers (8) and rotate the respective glass panel (6) into the required new direction before it is lowered and conveyed further,
 d) the rotation of the rollers (7) in the area of the second roller conveyor acting as the angle conveyor is accomplished in unison with a device for adjusting the spacing of the carriers (9) in this area,
 e) the entire process of precise-path conveying and rotating of the glass panels (6) is monitored by means of a device for monitoring the positioning of a glass panel (6) by means of lasers and/or sensors.

8. The method as claimed in claim 7, wherein the method is controlled so as to ensure, by means of the structures resembling a helix applied to the surface of the carrier rollers (8), that a glass panel (6) to be conveyed on the roller conveyor does not swing up and remains on a precise path.

9. A computer program having a program code for performing the steps of the method as claimed in claim 7, when the program is executed on a computer.

10. A machine-readable carrier having a program code of a computer program for performing the method as claimed in claim 7, when the program is executed on a computer.

\* \* \* \* \*